United States Patent
Yu

(10) Patent No.: US 10,193,105 B2
(45) Date of Patent: Jan. 29, 2019

(54) ULTRAVIOLET IRRADIATION DEVICE FOR PACKAGE OF LIGHT-EMITTING DIODE

(71) Applicant: Wuhan China Star Optoelectronics Technology Co., Ltd., Wuhan, Hubei (CN)

(72) Inventor: Wei Yu, Hubei (CN)

(73) Assignee: WUHAN CHINA STAR OPTOELECTRONICS TECHNOLOGY CO., LTD., Wuhan (CN)

( * ) Notice: Subject to any disclaimer, the term of this patent is extended or adjusted under 35 U.S.C. 154(b) by 0 days.

(21) Appl. No.: 15/327,223

(22) PCT Filed: Dec. 28, 2016

(86) PCT No.: PCT/CN2016/112570
§ 371 (c)(1),
(2) Date: Jan. 18, 2017

(87) PCT Pub. No.: WO2018/119726
PCT Pub. Date: Jul. 5, 2018

(65) Prior Publication Data
US 2018/0212205 A1    Jul. 26, 2018

(30) Foreign Application Priority Data
Dec. 26, 2016   (CN) .......................... 2016 1 1215900

(51) Int. Cl.
*H01L 51/56* (2006.01)
*F26B 21/14* (2006.01)
(Continued)

(52) U.S. Cl.
CPC .............. *H01L 51/56* (2013.01); *F26B 3/283* (2013.01); *F26B 21/14* (2013.01); *H01L 51/5237* (2013.01)

(58) Field of Classification Search
CPC ...... H01L 51/56; H01L 51/5237; F26B 21/14; F26B 3/283
(Continued)

(56) References Cited

U.S. PATENT DOCUMENTS

| 5,010,659 A * | 4/1991 | Treleven | ................ F26B 3/283 34/269 |
| 6,399,922 B2 * | 6/2002 | Okase | ................ C23C 14/083 118/724 |

(Continued)

FOREIGN PATENT DOCUMENTS

| CN | 2487193 | 4/2002 |
| CN | 101069453 | 11/2007 |

(Continued)

OTHER PUBLICATIONS

Office Action and Search Report, dated Apr. 11, 2018, for Chinese Patent Application No. 201611215900.3.
(Continued)

*Primary Examiner* — Stephen M Gravini

(57) ABSTRACT

Disclosed is an ultraviolet irradiation device for package of a light-emitting diode. The ultraviolet irradiation device includes a sealed shell. A light-emitting diode to be packaged is arranged in the shell, and a UV mask that is movable in the shell is arranged below the light-emitting diode. The ultraviolet irradiation device further includes a UV lamp arranged below the UV mask. The ultraviolet irradiation device further includes a sealed chamber which is in communication with the shell. The chamber is arranged at a side of the shell. A first rolling unit that is configured to deliver the light-emitting diode is arranged in the chamber, and a first gate and a second gate are respectively arranged at two ends of the chamber. The chamber is further in communication with an air exhaust unit and a first gas source respectively. The structure of the ultraviolet irradiation
(Continued)

device is simple. When a replacement of the UV mask is performed, a rapid replacement thereof can be achieved, i.e., much time for replacing the UV mask can be saved, which is beneficial for improving productivity.

15 Claims, 2 Drawing Sheets

(51) Int. Cl.
*F26B 3/28* (2006.01)
*H01L 51/52* (2006.01)

(58) Field of Classification Search
USPC .......................................................... 34/276
See application file for complete search history.

(56) References Cited

U.S. PATENT DOCUMENTS

| | | | | |
|---|---|---|---|---|
| 6,931,756 | B2* | 8/2005 | Morgan | F26B 9/003 |
| | | | | 165/61 |
| 8,458,923 | B2* | 6/2013 | Mackinnon | F26B 3/28 |
| | | | | 118/620 |
| 8,844,158 | B2* | 9/2014 | Dehn | A61F 13/00008 |
| | | | | 156/305 |
| 9,863,699 | B2* | 1/2018 | Corbin, III | F26B 5/06 |
| 2001/0054385 | A1* | 12/2001 | Horiguchi | C23C 16/4581 |
| | | | | 118/723 R |
| 2003/0143423 | A1* | 7/2003 | McCormick | H01L 51/5237 |
| | | | | 428/690 |
| 2004/0043140 | A1* | 3/2004 | Jagannathan | H01L 51/0003 |
| | | | | 427/66 |
| 2005/0016462 | A1* | 1/2005 | Yamazaki | C23C 14/12 |
| | | | | 118/726 |
| 2006/0027804 | A1* | 2/2006 | Yamazaki | G02F 1/1368 |
| | | | | 257/59 |
| 2008/0003372 | A1* | 1/2008 | Kamps | B05D 3/0486 |
| | | | | 427/430.1 |
| 2009/0039772 | A1* | 2/2009 | Takashima | H01J 37/32541 |
| | | | | 313/504 |
| 2014/0048494 | A1* | 2/2014 | Simmons, Jr. | C02F 1/72 |
| | | | | 210/748.12 |
| 2015/0036341 | A1* | 2/2015 | Ge | F21V 3/061 |
| | | | | 362/240 |
| 2018/0212205 | A1* | 7/2018 | Yu | H01L 51/56 |

FOREIGN PATENT DOCUMENTS

| | | | | |
|---|---|---|---|---|
| CN | 101069453 | A | 11/2007 | |
| CN | 101332648 | | 12/2008 | |
| CN | 101527255 | | 9/2009 | |
| CN | 102185120 | A | 9/2011 | |
| CN | 103323971 | | 9/2013 | |
| CN | 203192799 | | 9/2013 | |
| EP | 2199447 | B8 * | 1/2013 | ....... A61F 13/00008 |
| JP | 2002118087 | | 4/2002 | |
| JP | 2006339049 | | 12/2006 | |
| JP | 5072184 | B2 * | 11/2012 | ............. C23C 14/12 |
| WO | WO 03078909 | A1 * | 9/2003 | ............. F26B 9/066 |
| WO | 2013073067 | | 5/2013 | |
| WO | WO 2015191599 | A3 * | 4/2016 | ................ F26B 5/06 |
| WO | WO 2018119726 | A1 * | 7/2018 | ............. H01L 51/56 |

OTHER PUBLICATIONS

Search Report and Written Opinion, dated Aug. 2, 2017, for International Application No. PCT/CN2016/112570.
Office Action and Search Report, dated Nov. 16, 2017, for Chinese Patent Application No. 201611215900.3.

* cited by examiner

ULTRAVIOLET IRRADIATION DEVICE FOR PACKAGE OF LIGHT-EMITTING DIODE

CROSS-REFERENCE TO RELATED APPLICATIONS

This application claims the priority of Chinese patent application CN201611215900.3, entitled "ultraviolet irradiation device for package of light-emitting diode" and filed on Dec. 26, 2016, the entirety of which is incorporated herein by reference.

FIELD OF THE INVENTION

The present disclosure relates to an irradiation device, and in particular, to an ultraviolet irradiation device for package of a light-emitting diode.

BACKGROUND OF THE INVENTION

An organic light-emitting diode (OLED) display device possesses a plurality of advantages. Currently, many manufacturers of display devices carry out development, research, or production of the organic light-emitting diode display device. In glass package methods of an organic light-emitting diode, UV glue package and frit glue package are common, and a UV glue curing process is involved in both methods. Since package of the organic light-emitting diode needs to be carried out in an $N_2$ environment, an $N_2$ environment is provided inside a UV curing machine. A side view of the UV curing machine and a top view thereof are shown in FIG. 1 and FIG. 2. A UV mask 2 needs to be changed when a panel 1 of a different size is to be produced. The UV mask 2 comprises a mask frame 21 and a mask effective region 22. The UV mask 2 is arranged on a pin 5. A UV lamp 4 is arranged below the UV mask 2. When the UV mask 2 is to be changed, a chamber 3 needs to be opened to destroy the $N_2$ environment, and then the UV mask 2 is changed. The $N_2$ environment is recovered by inflating $N_2$ after the chamber 3 is closed. It takes more than 6 hours to recover the $N_7$, environment so as to meet the production requirements ($H_2O/O_2$<10 ppm). Such a long duration results in a large amount of productivity consumption.

In order to solve the current problem, it is necessary to provide a new ultraviolet irradiation device for package of a light-emitting diode.

SUMMARY OF THE INVENTION

An ultraviolet irradiation device for package of a light-emitting diode provided in the present disclosure has a simple structure. When a replacement of a UV mask is performed, a rapid replacement thereof can be achieved, i.e., much time for replacing the UV mask can be saved, which is beneficial for improving productivity.

In order to achieve the above objective, an ultraviolet irradiation device for package of a light-emitting diode is provided in the present disclosure. The ultraviolet irradiation device comprises a closed shell. The light-emitting diode to be packaged is arranged in the shell, and a UV mask that is movable in the shell is arranged below the light-emitting diode. The ultraviolet irradiation device further comprises a UV lamp, which is arranged below the UV mask. The ultraviolet irradiation device further comprises a closed chamber which is in communication with the shell. The chamber is arranged at a side of the shell. A first rolling unit configured to deliver the light-emitting diode is arranged in the chamber, and a first gate and a second gate are respectively arranged at two ends of the chamber. The chamber is further in communication with an air exhaust unit and a first gas source, respectively.

As for the above mentioned ultraviolet irradiation device, a second rolling unit is arranged in the shell, and the light-emitting diode is arranged above the second rolling unit.

As for the above mentioned ultraviolet irradiation device, an opening is arranged at a side of the shell near the chamber, and the chamber is in communication with the shell via the opening. The second gate is configured to control the opening to be opened or closed.

As for the above mentioned ultraviolet irradiation device, the first rolling unit is arranged opposite the second rolling unit to form a delivery unit configured to deliver the UV mask.

As for the above mentioned ultraviolet irradiation device, a first gas is nitrogen.

As for the above mentioned ultraviolet irradiation device, a mask block bar is arranged at an end of the first rolling unit far away from the shell, and the mask block bar is movable in the chamber.

As for the above mentioned ultraviolet irradiation device, a clamping part which is configured to clamp the UV mask is arranged at an end of the mask block bar near the shell.

As for the above mentioned ultraviolet irradiation device, a mask block bar is arranged at an end of the second rolling unit far away from the chamber, and the mask block bar is movable in the shell.

As for the above mentioned ultraviolet irradiation device, a clamping part which is configured to clamp the UV mask is arranged at an end of the mask block bar near the chamber.

As for the above mentioned ultraviolet irradiation device, a positioning pin is arranged at an end of the UV mask near the chamber, and guide wheels are arranged at two sides of the UV mask.

The ultraviolet irradiation device for package of the light-emitting diode provided in the present disclosure has a simple structure. When a replacement of the UV mask is performed, a rapid replacement thereof can be achieved, i.e., much time for replacing the UV mask can be saved, which is beneficial for improving productivity. In the present disclosure, the first rolling unit is arranged opposite the second rolling unit to form a delivery unit that can deliver the UV mask, so that the UV mask can be delivered stably from the shell to the chamber. Besides, a mask block bar is arranged at an end of the second rolling unit far away from the chamber, so that the UV mask can be arranged stably in the shell; and a mask block bar is arranged at an end of the first rolling unit far away from the shell so as to prevent a side wall of the chamber from being bumped by the UV mask when the UV mask is delivered from the shell to the chamber, i.e., the UV mask can be protected effectively.

The above technical features can be combined in various suitable manners or can be replaced by the equivalent technical features as long as the objective of the present disclosure can be achieved.

BRIEF DESCRIPTION OF THE DRAWINGS

The drawings described herein are merely for the purpose of illustration rather than limiting the scope of disclosure of the present disclosure in any means. Moreover, shapes, proportions, and sizes of respective components in the drawings are merely schematic, and they are for better understanding of the present disclosure rather than specifically limiting the shapes, the proportions, and the sizes of respective components of the present disclosure. Under teachings of the present disclosure, a person skilled in the art can carry out the present disclosure by selecting various possible shapes, proportions, and sizes based on specific conditions.

Figure 1:
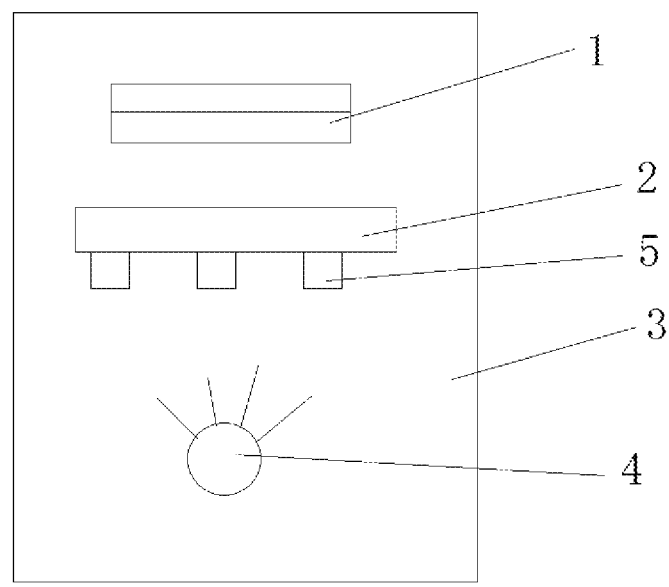
FIG. 1 is a side view of an ultraviolet curing machine in the prior art
Figure 2:
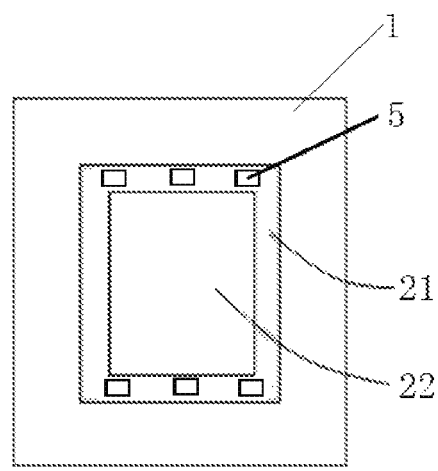
FIG. 2 is a top view of the ultraviolet curing machine in the prior art.

In the drawings, same drawing reference signs are used for a same component. The drawings are not based on the actual proportions.

DETAILED DESCRIPTION OF THE EMBODIMENTS

Details of the present disclosures can be better understood with reference to the drawings in combination with descriptions of specific embodiments of the present disclosure. However, the specific implementing manners of the present disclosure described herein are merely for explaining the present disclosure rather than limiting the present disclosure in any means. Under teachings of the present disclosure, a skilled person can conceive of any possible transformations on the basis of the present disclosure, all of which should be regarded as being within the scope of the present disclosure. The present disclosure will be further illustrated hereinafter in combination with the drawings.

Figure 3:
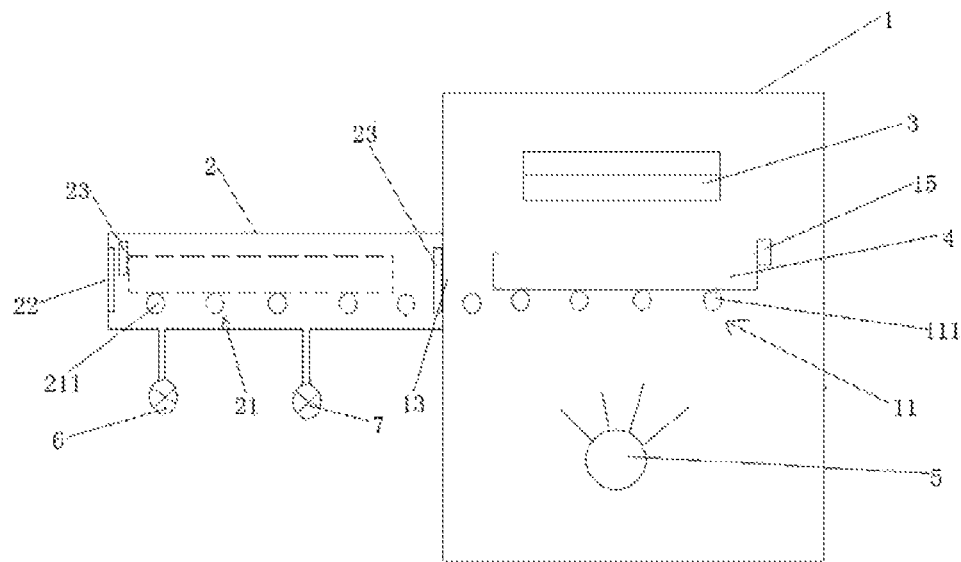
FIG. 3 is a side view of an ultraviolet irradiation device in the present disclosure.
Figure 4:
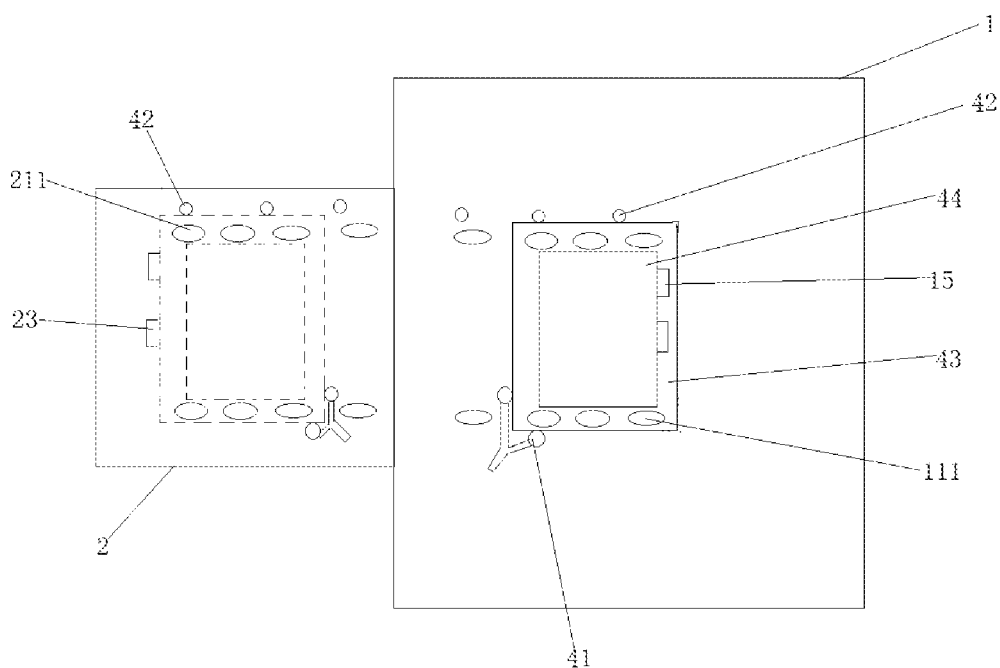
FIG. 4 is a top view of the ultraviolet irradiation device in the present disclosure.

FIG. 3 and FIG. 4 are a side view of an ultraviolet irradiation device and a top view of the ultraviolet irradiation device of the present disclosure, respectively.

As shown in FIG. 3, the ultraviolet irradiation device of the present disclosure is used for package of a light-emitting diode. The ultraviolet irradiation device comprises a shell 1 and a chamber 2. The shell 1 is sealed. A light-emitting diode 3 to be packaged is arranged in the shell 1; a UV mask 4, which is movable in the shell 1, is arranged below the light-emitting diode 3; and a UV lamp source 5 is arranged below the UV mask 4. The chamber 2 is sealed, and is in communication with the shell 1. The chamber 2 is arranged at a side of the shell 1. A first rolling unit 21 which is configured to deliver the light-emitting diode 3, is arranged in the chamber 2; a first gate 22 and a second gate 23 are respectively arranged at two ends of the chamber 2; and the chamber 2 is further in communication with an air exhaust unit 6 and a first gas source 7, respectively.

Specifically, in the present disclosure, since package of the light-emitting diode needs to be performed in an N₂ environment, the shell 1 is filled with nitrogen. The UV mask 4 moves in the shell 1 by means of a second rolling unit 11. In one specific embodiment, the second rolling unit 11 comprises a plurality of rollers 111, and the UV mask 4 is driven to move in the shell 1 by rotation of the rollers 111.

Specifically, in the present disclosure, a first gas is nitrogen, and a suction pump device is used as the air exhaust unit 6. In the chamber 2, the first rolling unit 21 also comprises a plurality of rollers 211, and the UV mask 4 is driven to move in the chamber 2 by rotation of the rollers 211. Furthermore, the first rolling unit 21 is arranged opposite the second rolling unit 11 to form a delivery unit configured to deliver the UV mask 4. In the present embodiment, the rollers 211 are arranged opposite the rollers 111 so that it is convenient to deliver the light-emitting diode 3 from the shell 1 to the chamber 2 or to deliver the light-emitting diode 3 from the chamber 2 to the shell 1.

An opening 13 is arranged at a left side of the shell 1. The chamber 2 is in communication with the shell 1 via the opening 13. The second gate 23 is configured to control the opening 13 to be in an open or closed state.

As shown in FIG. 3 and FIG. 4, a mask block bar 23 is arranged at an end of the first rolling unit 21 far away from the shell 1. The mask block bar 23 is configured to move upwards or downwards or move leftwards or rightwards in the chamber 2 so as to prevent a side wall of the chamber 2 from being bumped by the UV mask 4 when the UV mask 4 is delivered from the shell 1 to the chamber 2. That is, the UV mask 4 can be protected effectively.

The UV mask 4 comprises a mask frame 43 and a mask effective region 44. The structure is commonly known in the art, and it will not be described herein.

A clamping part, which is configured to clamp the UV mask 4, is arranged at an end of the mask block bar 23 near the shell 1 (the clamping part is not shown in the drawings).

Further, a mask block bar 15 is arranged at an end of the second rolling unit 11 far away from the chamber 2. The mask block bar 15 is configured to move upwards or downwards or move leftwards or rightwards in the shell 1. In one embodiment, a clamping part, which is configured to clamp the UV mask 4, is arranged at an end of the mask block bar 15 near the chamber 2 (the clamping part is not shown in the drawings).

Furthermore, as shown in FIG. 4, in the shell 1, a positioning pin 41 is arranged at an end of the UV mask 4 near the chamber 2. Guide wheels 42 are arranged at two sides of the UV mask 4, and guide wheels 42 are also arranged in the chamber 2.

A process of changing the UV mask 4 by using the ultraviolet irradiation device of the present disclosure is provided as follows.

When a UV mask 4 needs to be changed, both a first gate 22 and a second gate 23 are in a closed state. An air exhaust unit 6 exhausts gas in a chamber 2, and then the chamber 2 is tilled with nitrogen by a first gas source 7 so that a nitrogen environment is provided in the chamber 2. The second gate 23 is opened, and a clamping part of a mask block bar 23 is opened. The mask block bar 23 is moved rightwards and then is moved downwards. Meantime, a positioning pin 41 is rotated to move downwards. A driving system is activated so as to enable rollers 111 and rollers 211 to rotate, and the UV mask 4 is driven to move from a shell 1 to the chamber 2 by rotations of the rollers 111. After the UV mask 4 is moved into the chamber 2, the second gate 23 is closed, and the driving system is closed. A clamping part on a mask block bar 15 is opened to clamp the UV mask 4, and the mask block bar 15 is moved so that the UV mask 4 is opposite the first gate 22. The clamping part on the mask block bar 15 is opened again so that the UV mask 4 is separated from the clamping part, and the mask block bar 15 is moved downwards. The first gate 22 and the driving system are opened. The driving system enables the rollers 211 to rotate, and the rollers 211 drives the UV mask 4 to move out of the chamber 2, i.e., an original UV mask 4 is taken out. A new UV mask 4 is put into the chamber 2 via the first gate 22, and the first gate 22 is closed. The air exhaust unit 6 exhausts gas in the chamber 2, and then the chamber 2 is filled with nitrogen by the first gas source 7. The second gate 23 is opened, and the driving system is opened. The driving system enables the rollers 111 and the rollers 211 to rotate so as to drive the UV mask 4 to move from the chamber 2 to the shell 1. After the UV mask 4 is delivered into the shell 1, the second gate 23 is closed. After the UV mask 4 is delivered to a specific position by the rollers 111, the clamping part of the mask block bar 23 is opened. The mask block bar 23 is moved upwards and then is moved leftwards. Meantime, the positioning pin 41 is rotated to move upwards so that a first end of the UV mask 4 is positioned by the positioning pin 41 and a second end thereof is fixed by the mask block bar 23 through clamping. Therefore, the UV mask 4 can be stably arranged in a working position in the shell 1. That is, a change of the UV mask 4 is completed.

In the present disclosure, the chamber 2 has a small volume, and is configured to coordinate with the air exhaust unit to exhaust gas and to coordinate with the first gas source for filling of nitrogen. It takes 20 to 30 minutes to provide a nitrogen environment suitable for production in the chamber 2, which is far less than a 6-hour duration for restoring the nitrogen environment in a machine required in a traditional replacement of the UV mask. Much time for replacing the UV mask can be saved, so that an effect of improving productivity can be achieved.

The above technical solution is merely one embodiment of the present disclosure. For a person skilled in the art, based on the application method and principle disclosed in the present disclosure, it would be easy to make various types of improvements or transformations to the embodiment, and the present disclosure is not limited to the method described in the specific implementation manner of the present disclosure. The present disclosure is described with reference to preferable embodiments, but without departing from the scope of the present disclosure, various improvements can be made, or equivalent components can be used to replace parts therein. Particularly, as long as there is no structural conflict, technical features defined in each embodiment can be combined with each other in any manner. The present disclosure is not limited to the specific embodiments disclosed herein, but comprises all technical solutions falling within the scope of the claims.

The invention claimed is:

1. An ultraviolet irradiation device for package of a light-emitting diode, wherein the ultraviolet irradiation device comprises:
a sealed shell, wherein the light-emitting diode to he packaged is arranged in the shell, and a UV mask that is movable in the shell is arranged below the light-emitting diode;
a UV lamp, which is arranged below the UV mask; and
a sealed chamber which is in communication with the shell, wherein the chamber is arranged at a side of the shell, wherein a first rolling unit configured to deliver the light-emitting diode is arranged in the chamber, and a first gate and a second gate are respectively arranged at two ends of the chamber, and wherein the chamber is further in communication with an air exhaust unit and a first gas source respectively.

2. The ultraviolet irradiation device according to claim I, wherein a second rolling unit is arranged in the shell, and the light-emitting diode is arranged above the second rolling unit.

3. The ultraviolet irradiation device according to claim 1, wherein an opening is arranged at a side of the shell near the chamber, the chamber being in communication with the shell via the opening, and the second gate is configured to control the opening to be opened or closed.

4. The ultraviolet irradiation device according to claim 2, wherein the first rolling unit is arranged opposite the second rolling unit to form a delivery unit configured to deliver the UV mask.

5. The ultraviolet irradiation device according to claim 1, wherein a first gas is nitrogen.

6. The ultraviolet irradiation device according to claim 1, wherein a mask block bar is arranged at an end of the first rolling unit far away from the shell, and the mask block bar is movable in the chamber.

7. The ultraviolet irradiation device according to claim 6, wherein a clamping part which is configured to clamp the UV mask is arranged at an end of the mask block bar near the shell.

8. The ultraviolet irradiation device according to claim 2, wherein a mask block bar is arranged at an end of the second rolling unit far away from the chamber, and the mask block bar is movable in the shell.

9. The ultraviolet irradiation device according to claim 8, wherein a clamping part which is configured to clamp the UV mask is arranged at an end of the mask block bar near the chamber.

10. The ultraviolet irradiation device according to claim 8, wherein a positioning pin is arranged at an end of the UV mask near the chamber, and guide wheels are arranged at two sides of the UV mask.

11. The ultraviolet irradiation device according to claim 4, wherein a mask block bar is arranged at an end of the first rolling unit far away from the shell, and the mask block bar is movable in the chamber.

12. The ultraviolet irradiation device according to claim 11, wherein a clamping part which is configured to clamp the UV mask is arranged at an end of the mask block bar near the shell.

13. The ultraviolet irradiation device according to claim 11, wherein a mask block bar is arranged at an end of the second rolling unit far away from the chamber, and the mask block bar is movable in the shell.

14. The ultraviolet irradiation device according to claim 13, wherein a clamping part which is configured to clamp the UV mask is arranged at an end of the mask block bar near the chamber.

15. The ultraviolet irradiation device according to claim 13, wherein a positioning pin is arranged at an end of the UV mask near the chamber, and guide wheels are arranged at two sides of the UV mask.

* * * * *